United States Patent [19]

Masumi

[11] Patent Number: 5,371,067
[45] Date of Patent: Dec. 6, 1994

[54] SUPERCONDUCTIVE PHOTOCONDUCTIVE SUBSTANCE OF THE BA-PB-BI-O GROUP SYSTEM AND A METHOD FOR PRODUCING THE SAME

[75] Inventor: Taizo Masumi, Yokohama, Japan
[73] Assignee: The University of Tokyo, Tokyo, Japan
[21] Appl. No.: 95,997
[22] Filed: Jul. 23, 1993

Related U.S. Application Data

[63] Continuation of Ser. No. 684,489, Apr. 15, 1991, abandoned, which is a continuation of Ser. No. 392,801, Aug. 11, 1989, abandoned.

[30] Foreign Application Priority Data

Aug. 12, 1988 [JP] Japan .................................. 63-201653

[51] Int. Cl.$^5$ ...................... H01B 12/00; H01L 39/12
[52] U.S. Cl. .................................. 505/181; 505/784; 252/501.1; 250/492.1; 250/492.2
[58] Field of Search ................. 505/784, 1; 250/492.1, 250/492.2; 252/501.1

[56] References Cited

U.S. PATENT DOCUMENTS 3,932,315  1/1976  Sleight .
4,990,487  2/1992  Masumi .................................. 505/1
5,168,165 12/1992  Masumi ............................ 250/492.1

FOREIGN PATENT DOCUMENTS 354811  2/1990  European Pat. Off. .

OTHER PUBLICATIONS

Hikata et al. "Temperature Dependence of the Elastic Modulus of Polycrystalline $BaPb_{1-x}Bi_xO_3$" Phys. Rev. B vol. 36(10), 1 Oct. 1987, pp. 5578–5580.
Tajima et al. "Electronic States of $BaPb_{1-x}Bi_xO_3$ in the Semiconducting Phase..." Physical Review B, vol. 35, No. 2, pp. 696–703, Jan. 15, 1987.
Sakamoto et al., "Photoemission Studies of Electronic Structures of $BaPb_{1-x}Bi_xO_3$" Journal of the Physical Society of Japan, vol. 56, No. 1, pp. 365–369, Jan. 1987.
Sugai (I), "Dimerization model for the metal-semiconductor transition in . . ." Physical Review B, vol. 35, No. 7, pp. 3621–3624, Mar. 1, 1987.
Jurczek, "Model study of the semiconductor-metal transition . . . " Physical Review B, vol. 35, No. 13, pp. 6997–7003, May 1, 1987.
Sugai (II), "Lattice Vibrations at the Metal-Semiconductor Transition . . . " J. Journal App. Phys, Supplement 26-3, vol. 26, 1987, pp. 1123–1124.
Hidaka et al., "Structural and Dielectric Modulations of $BaPb_{1-x}Bi_xO_3$" J. Journal App. Phys., Supplement 26-3, vol. 26, 1987, pp. 1111–1112.
Weber, "Are Pb-Bi Ordering Waves Instrumental for the Metal-Insulator . . . " J. Journal Appl. Phys, Supplement 26-3, vol. 26, 1987, pp. 981–982.
Takegahara et al. "APW Band Structure of Cubic $BaPb_{1-x}Bi_xO_3$" Journal of the Physical Society of Japan, vol. 56, No. 4, pp. 1478–1489, Apr. 1987.
Uemura et al. "Absence of Magnetic Order in (Ba,K)BiO_3" Nature, vol. 335, Sep. 8, 1988, pp. 151–152.
Katsui et al., "Growth of Superconducting Ba(PhyBi)O_3 Crystals" J. Crystal Growth, 66(1–2), 1984, pp. 228–230.
Journal of the Physical Society of Japan, vol. 57, No. 8 Aug. 1988.
Solid State Communications, vol. 60, No. 12 Dec. 1986.
Journal of the Physical Society of Japan, vol. 56, No. 12 Dec. 1987.

Primary Examiner—Paul Lieberman
Assistant Examiner—M. Kopec
Attorney, Agent, or Firm—Sughrue, Mion, Zinn, Macpeak & Seas

[57] ABSTRACT

The disclosed oxide has a general chemical formula of $Ba-Pb_{1-x}-Bi_x-O_z$, x being 0.35 to 1 and z being 2.7 to 3, and the oxide shows a potential superconductivity at a temperature below 14K and a photoconductivity at a temperatures below 160K at least in an exciting wavelength range of 500 to 700 nm depending on the value of the above x.

The oxide is made by heating a mixture of starting materials for the desired composition at 750–850° C. for 2–10 hours so as to cause solid phase reaction in the mixture, cooling the heated materials gradually, shaping the cooled mixture under pressure, reheating the shaped materials at 500–850° C. for 2–10 hours so as to effect secondary sintering thereon, keeping the reheated materials at 600–500° C. for 2–3 hours and cooling the same either extremely quickly at a rate of 1500–900° C./sec or slowly at a rate of 150–200° C./hour.

8 Claims, 7 Drawing Sheets

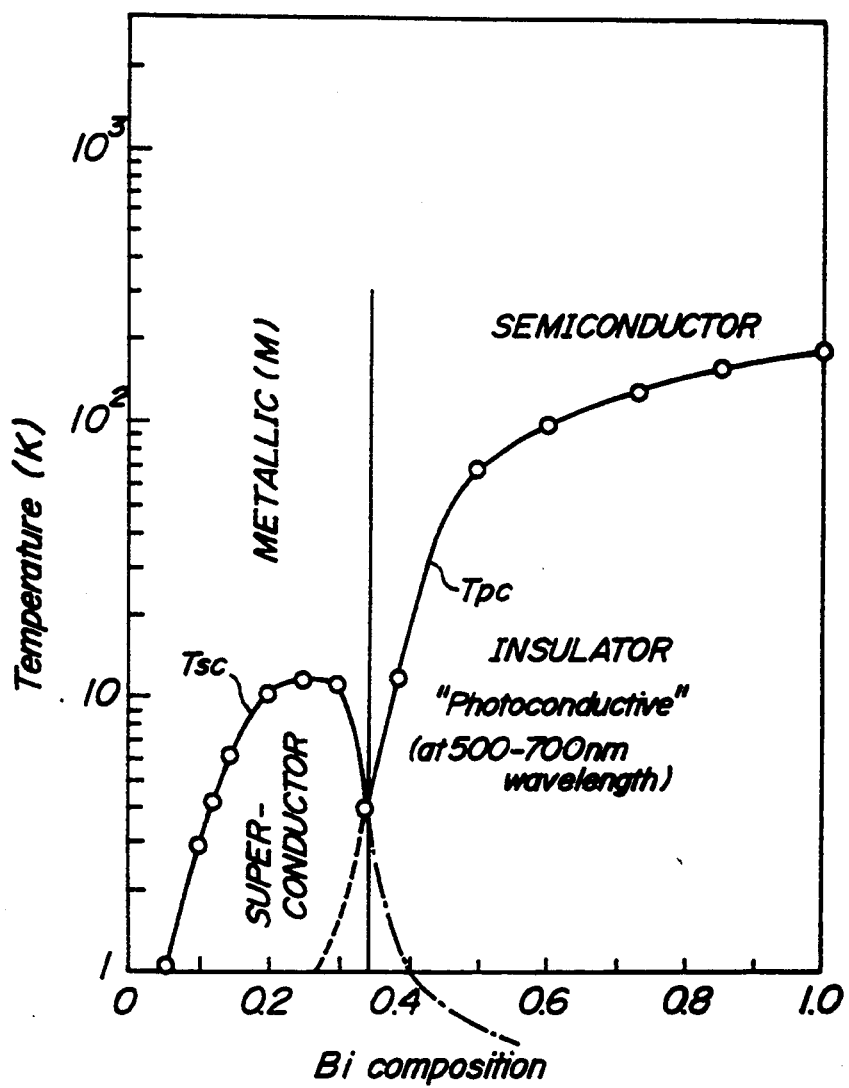

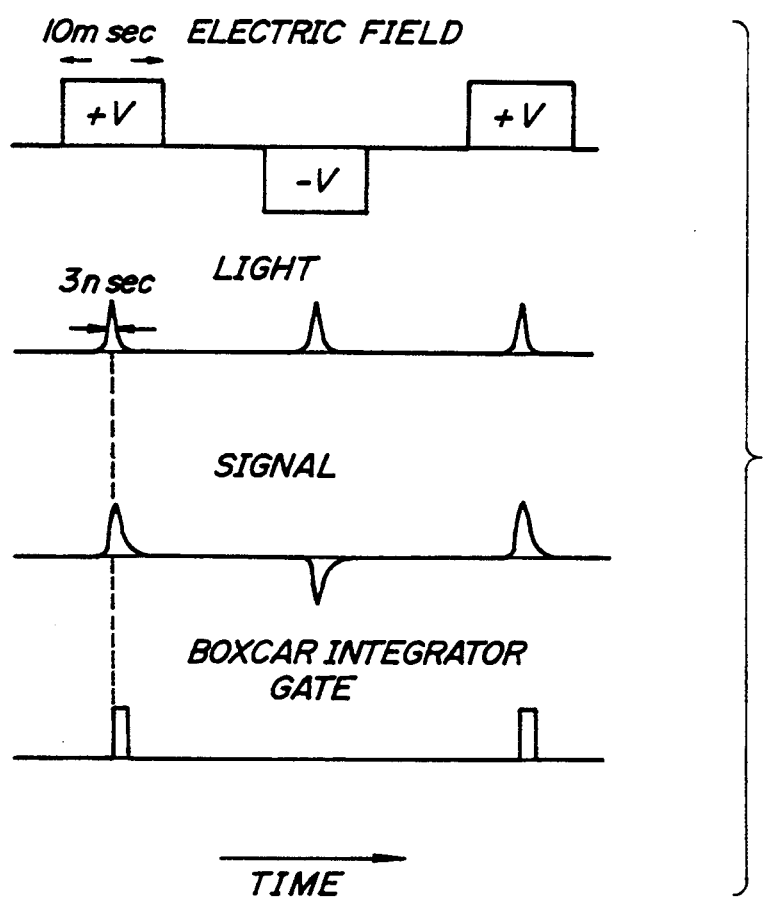
FIG._2C

FIG_3A
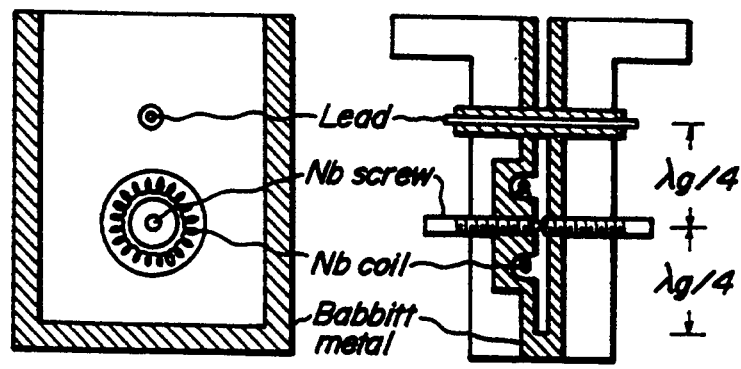
FIG_3B
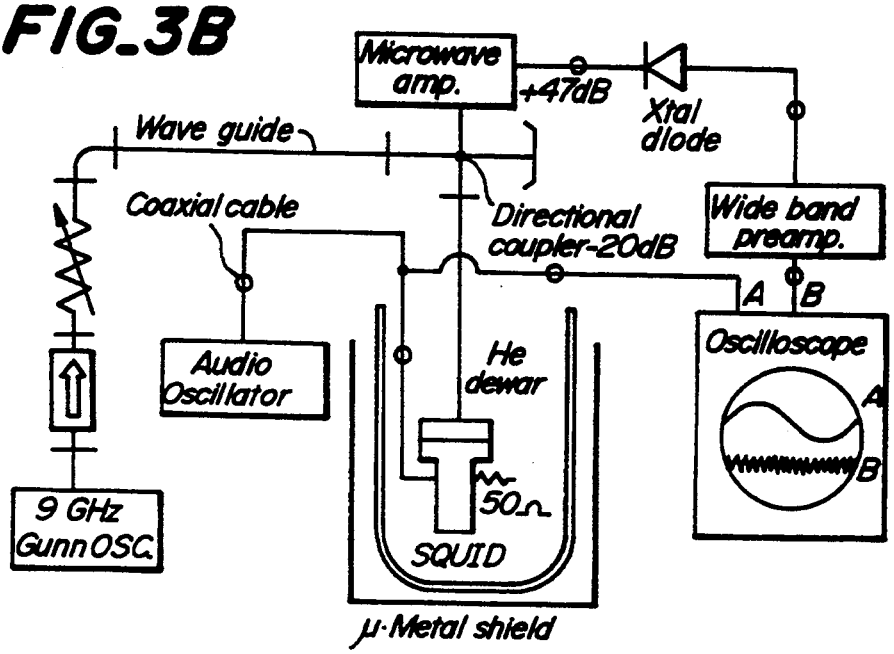
FIG_3C
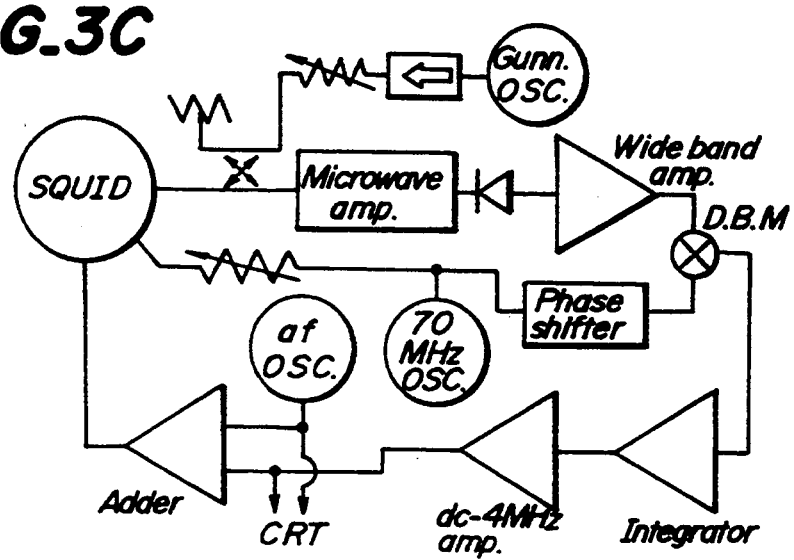

FIG._5A
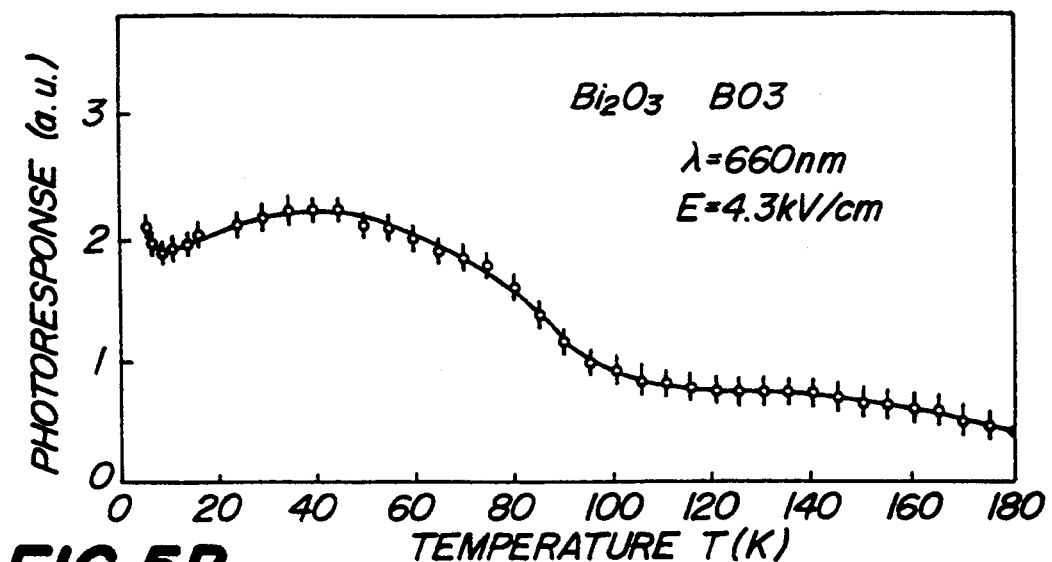
FIG._5B
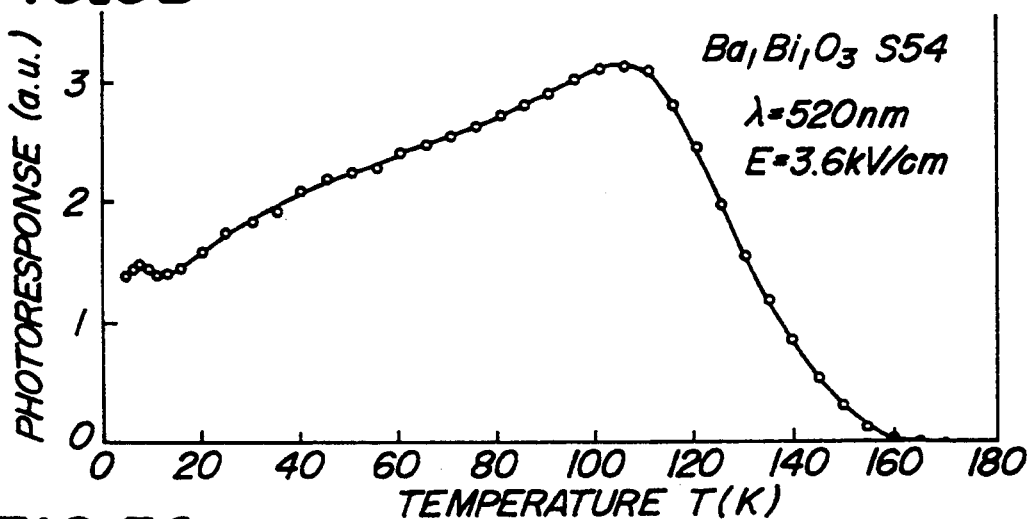
FIG._5C
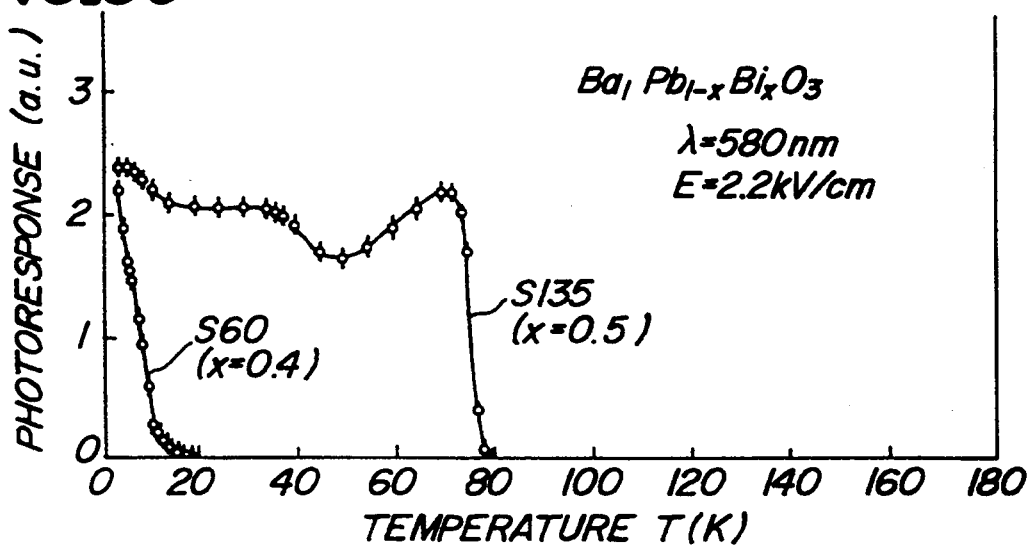

SUPERCONDUCTIVE PHOTOCONDUCTIVE SUBSTANCE OF THE BA-PB-BI-O GROUP SYSTEM AND A METHOD FOR PRODUCING THE SAME

This is a continuation of application Ser. No. 07/684,489 filed on Apr. 15, 1991, now abandoned which is a continuation of prior parent application Ser. No. 07/392,801 filed Aug. 11, 1989 (now abandoned).

BACKGROUND OF THE INVENTION

1. Field of the Invention

This invention relates to superconductive photoconductive oxide. The inventor performed experiments on optical properties, especially on the photoconductivity in response to high-speed pulses, of those oxides whose composition is outside that of regular oxide superconductors, and the inventor has found that oxides with a chemical formula $Ba-Pb_{1-x}-Bi_x-O_z$, from 1 to 0.4 and z being 2.7 to 3, revealed an unexpected correlation between the superconductivity and the photoconductivity thereof.

The invention also relates to a method for of the above oxide. In the method, the ratio of the above element contents x and z is independently controlled for instance by changing x from 1 to 0.4, or by regulating the value of z through either quick cooling or slow cooling while keep x constant, e.g., at x=0.40. When the oxide has an x value of not smaller than 0.45 ($x \geq 0.40$) or is quickly cooled, it becomes a semiconductor having photoconductivity. On the other hand, when the oxide has an x value of about 0.40 ($x \simeq 0.40$) or is slowly cooled, it becomes a photoconductive oxide correlative with superconductivity. The oxide of the invention is expected to be very useful in the industrial field of superconductive optoelectronics.

2. Related Art Statement

There has been no publications at all on such superconductor which has inherent photoconductivity, except the inventor's disclosure of $Y_{3-x}-Ba_x-Cu_y-O_z$ group and $La_2-Cu_1-O_z$ group substance in their academic papers and copending patent applications.

Conventional superconductors are metals or alloys thereof in the main. Recently, much attention has been paid to high-temperature oxide superconductors, such as superconductors of Y-Ba-Cu-O group, and considerable amounts of additives such as barium (Ba) and strontium (Sr) are used to modify or eventually raise the superconductive critical temperature ($T_c$). Studies and measurements on the optical properties of the superconductive substances at and in the proximity of visible wavelengths have been limited to the study of reflection and scattering of light therefrom due to the metallic properties of such substance.

It has been believed that light is simply reflected from the surface of a superconductor and is not allowed to enter therein. Study of optical properties, except the phenomena of reflection and scattering, has been treated as a completely different field from that of superconductivity in academic institutions, domestic and abroad, and in international conferences.

The reason for it is in that, generally speaking, researchers have considered that superconductivity is incompatible with such physical properties as light absorption and photoconductivity and they have assumed that light irradiation in a wave number with the excess energy over the energy gap of the BCS theory will merely destroy the stability of superconductivity.

However, there is the certain clear correlation between them, as proven in the case of Y-Ba-Cu-O group substance and the like. If any substance having such photoconductivity which is related to superconductivity or any substance having both superconductive capability and photoconductive capability is produced, a number of new electronic and optoelectronic devices may be developed; for instance, a superconductive phototransistor, a "superconductive optical computer" as a combination of the "superconductive computer" based on the Josephson devices and the "optical computer" proposed in optoelectronics both currently studied, "superconductive optical fiber", and the like.

Therefore, an object of the present invention is to provide a photoconductive substance correlative with superconductivity which is an insulator in the dark and at a temperature below 14K and simultaneously has a photoconductivity $Q(\lambda,T)$ at a temperature (T) below 160K depending on the value of the above x upon excitation by light in a wavelength ($\lambda$) range between 500 and 700 nm.

The superconductive photoconductive substance according to the invention has a general chemical formula of $Ba-Pb_{1-x}-Bi_x-O_z$, x being 0.40 to 1 and z being 2.7 to 3 and the substance is a photoconductive oxide correlative with superconductivity which is an insulator in the dark and at a temperature below 14K and simultaneously has a photoconductivity $Q(\lambda,T)$ at a temperature (T) below 160K depending on the value of the above x upon excitation by light in a wavelength ($\lambda$) range between 500 and 700 nm. With the method according to the invention, a mixture of starting materials is prepared for oxide with a general chemical formula of $Ba-Pb_{1-x}-Bi_x-O_z$, x being 0.40 to 1 and z being 2.7 ton 3, and the mixture is heated at 750°–850° C. for 2–10 hours so as to cause solid phase reaction in the mixture. The heated materials are gradually cooled, and they are shaped under pressure and heated again at 500°–850° C. for 2–10 hours so as to effect secondary sintering thereon. The secondarily sintered materials are kept at 600°–500° C. for 2–3 hours, and then cooled either extremely quickly at a rate of 1500°–900° C./sec or slowly at a rate of 150°–200° C./hour, whereby the desired superconductive photoconductive oxide is produced.

The reason for limiting the composition of the oxide of the invention to the above-mentioned general chemical formula is that the oxide of the such composition reveals photoconductivity $Q(\lambda, T)$ at a temperature (T) below 160K in an exciting wavelength ($\lambda$) of 500 to 700 nm, that temperature being correlative with the onset temperature of superconductivity of a superconductor of the Ba-Pb-Bi-O system. The photoconductive substance is provided by a method comprising the steps of heating at about 750°–850° C. for 2–10 hours so as to cause a solid phase reaction among the starting materials thereof, cooling gradually, shaping under pressure, secondarily sintering at 500°–850° C. for 2–10 hours, keeping at 600°–500° C. for 2–3 hours, and then cooling either extremely quickly at a rate of 1500°–900° C./sec or slowly at a rate of 150°–200° C./hour. The photoconductive substance is an insulator or semiconductor in the dark and not superconductor in the composition range, even though the composition range is very close to that of superconductive substances of the Ba-Pb-Bi-O system, but the compositions herein do not include the composition range of a superconductor.

The inventor has found that, as to the values of x and z of the general chemical formula of $Ba\text{-}Pb_{1-x}\text{-}Bi_x\text{-}O_z$ of the oxide of the invention, if x is unity (x=1) or close to unity, the oxide becomes insulating and shows semiconductive properties as well as photoconductive properties for certain wavelengths of light even with higher on set temperatures. On the other hand, as x departs from unity and approaches to about 0.40, the superconductive properties of the substance becomes more apparent while the photoconductive properties of the oxide is maintained with various on set temperatures. It is noted, however, that if $x \leq 0.40$ when z is in a range of 2.81 to 3, the oxide shows only superconductive properties and the photoconductive properties is lost, so that such oxide composition is excluded from the scope of the invention.

BRIEF DESCRIPTION OF THE DRAWINGS

For a better understanding of the invention, reference is made to the accompanying drawings, in which:

FIG. 1 is a graph showing the relationship between the physical properties of the oxide of the invention at different temperatures and the Bi content thereof;

FIG. 2C shows the time sequence and waveforms of pulses in the photoconductivity measurement;

FIG. 3A show sectional views of an essential part of a static susceptibility measuring device using a microwave SQUID (Superconducting Quantum Interference Device);

FIG. 3B is a block diagram of the measuring system with the device of FIG. 3A;

FIG. 3C is a block diagram of the feedback system with the device of FIG. 3A;

FIG. 5A is a graph showing the temperature-dependence of photoresponse $Q(\lambda, T)$ of the reference substance $Bi_2O_3$ for wavelength $\lambda=660$ nm;

FIG. 5B is a graph showing the temperature-dependence of photoresponse $Q(\lambda, T)$ of a superconductive photoconductive oxide of composition $Ba_1Bi_1O_3$ (x=1) for wavelength $\lambda=520$ nm; and FIG. 5C is a graph showing the temperature-dependence of photoresponse $Q(\lambda, T)$ of a superconductive photoconductive oxide of composition $Ba_1Pb_1\text{-}xBi_xO_z$ (x=0.5, 0.4 and z=3) for wavelength $\lambda=528$ nm.

DESCRIPTION OF THE PREFERRED EMBODIMENT

Figure 2A:
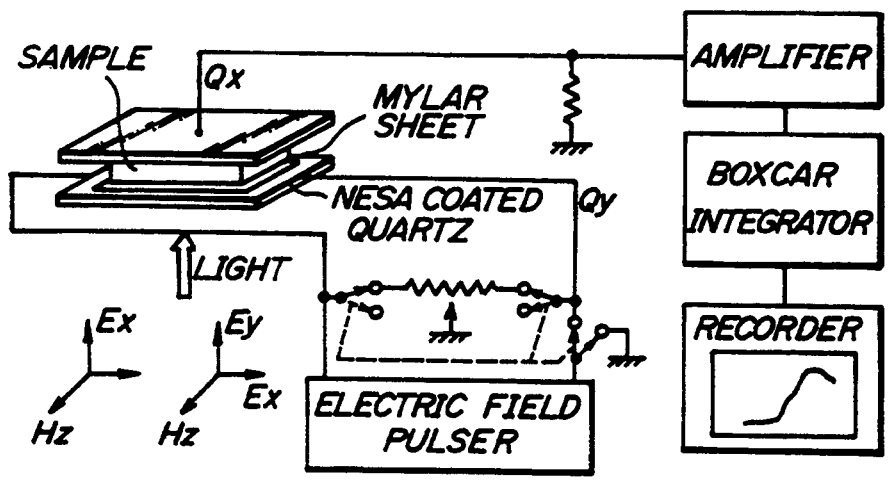
FIGS. 2A and 2B are diagrammatic illustrations of the principles of photoconductivity measurement by using blocking electrodes and applying repetitive electric and laser light pulses.

FIG. 1 shows a curve of superconductivity critical temperature Tsc and a curve of photoconductivity critical temperature Tpc for a wavelength range of 500°-700 nm, both curves being for the Ba-Pb-Bi-O system oxide including the composition of the invention $Ba\text{-}Pb_{1-x}\text{-}Bi_x\text{-}O_z$. Below the superconductivity critical temperature Tsc the oxide can become superconductive, and below the critical temperature Tpc the oxide can become photoconductive in response to incident light of the above wavelength range. In the figure, M stands for a metallic domain and S stands for a semiconductor domain.

Of the oxide composition $Ba\text{-}Pb_{1-x}\text{-}Bi_x\text{-}O_z$ of the invention, ingredient element concentrations for making insulator are for instance x=0.40-1.0 and z=2.7-3, while those for making superconductor are for instance x=0.15-0.40 and z=2.81-3. The inventor has shown that, even in the insulator domain, the temperature-dependence and exciting-wavelength-dependence of the photoconductivity implicate the presence of potential superconductivity, as will be made clear by ensuing Embodiments (refer to FIG. 1) whereby, the invention has been accomplished.

Most of conventional oxide compounds such as $Ba\text{-}Bi\text{-}O_z$ (z=2.7-3) and $Ba\text{-}Pb_{1-x}\text{-}Bi_x\text{-}O_z$ are normally semiconductors at the ground state, e.g., at low temperatures and in the dark. An elementary excitation can be created by giving a photon with a momentum of suitable magnitude and the corresponding amount of energy. Usually, for superconductors, these excitations beyond the energy gap destroy the superconductive ground state in the BCS theory. There is a possibility, however, to create a coherent state of elementary excitations above the ground state of insulating semiconductor such as bipolarons and excitons even in a thermally non-equilibrium state. We have found a new substance as an outcome of studies in fundamental physics and applied physics from the standpoint of the elementary excitation concept, in a sense parallel to, but rather orthogonal to the trend of studies of high-$T_c$ (critical temperature) superconductors. Namely, our finding relates to substance whose composition does not result in perfect superconductor, but the substance has a composition close to that of superconductor and reveals superconductive photoconductivity both superconductivity and photoconductivity. The present invention has been completed based on that finding.

The invention will be described in further detail by referring to embodiments.

Embodiments

The composition of the oxide found by the inventor can be expressed by a chemical formula of $Ba\text{-}Pb_{1-x}\text{-}Bi_x\text{-}O_3$. The inventor has tried to seek into details of the complete scheme, especially optical properties in visible wavelength range, of the phase diagram of such oxide. In particular, the inventor's studies covered not only the superconductive phase of the above oxide but also semiconductive phase and insulating phase thereof.

A large number of specimens of Ba-Bi-O and Ba-Pb-Bi-O systems were made from the powders of $BaCO_3$, PbO and $Bi_2O_3$ by using the method already described in numerous references. For instance, primary sintering of a mixture of starting materials was effected at 750°-900° C. so as to cause solid phase reaction for primary sintering of the mixture. After being cooled gradually, the sintered mixture was shaped under pressure, and secondary sintering was effected at 800°-850° C. The specimens were then annealed at 500°-600° C. and then cooled slowly. The composition of the starting materials was studied in detail, and the composition of the specimen was selected to be close to regular superconductors in such a manner that it became more or less controllable in a range outside that of the latter. Besides, the value of z in the above chemical formula was controlled by carefully regulating the method and speed of cooling.

Specimens #S54 (z=1), #S129 (x=0.8), #S128 (x=0.6), #S135 (x=0.5) and #S60 (x=0.4) were prepared in the above-mentioned manner.

Specimen #S54 with a composition of Ba-Bi-$O_3$ was prepared by primary sintering of a starting mixture of that composition at 800°-850° C. for 2 hours, slow cooling, shaping under pressure, secondary sintering at 800° C. for 2 hours, annealing at 600° C. for 2 hours, and slow cooling.

As a reference specimen of Bi system, a specimen #B03 was prepared by using $Bi_2O_3$ through the same heat treatment as above.

Since specimens of the a-Bi-$O_z$ and Ba-$Pb_{1-x}$-$Bi_x$-$O_z$ systems within a certain value range of x and z became highly insulating for most values of x and z, or at least semiconducting at low temperatures, the conventional techniques for resistivity measurements encountered several serious difficulties. In particular, problems caused by combination of the non-ohmic contact electrodes, the buildup of space charge and with the low signal-to-noise ratio due to low carrier density in high-impedance materials were very difficult to overcome.

Figure 2B:
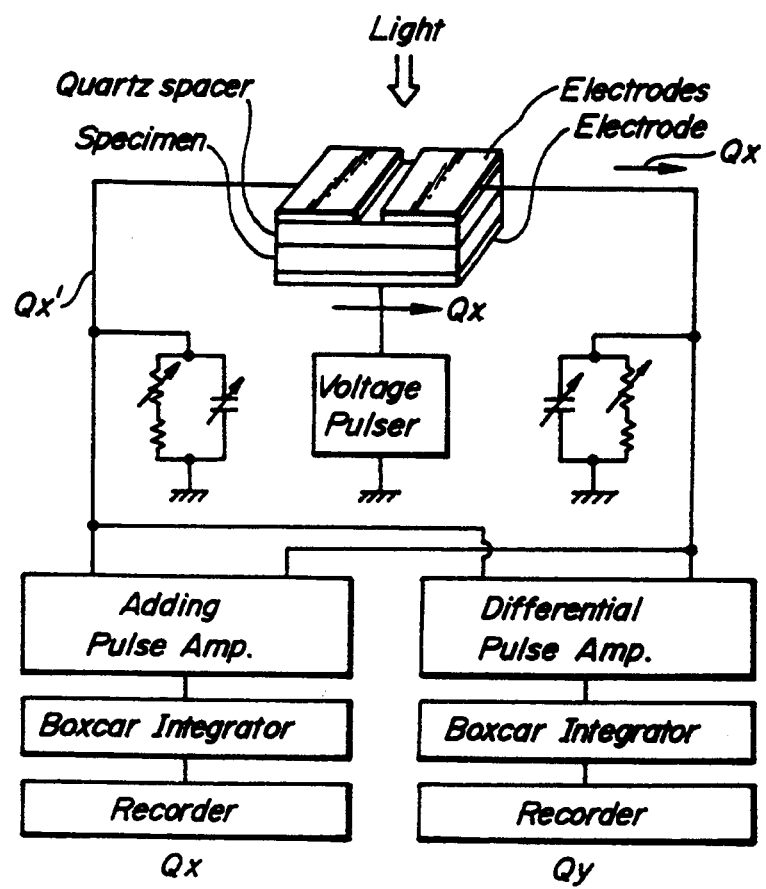

In the experiments of the inventor, two types of techniques were adopted for resistivity and/or conductivity measurements. First, to measure the insulating specimen #S54 ($\rho \geq 10^8 \Omega$-cm), a fast pulse technique with blocking electrodes as shown in FIGS. 2A and 2B was adopted. Referring to FIG. 2C, the difficulties noted above were overcome by using dye laser beam pulses of 3 ns width at a repetition rate of 13 Hz in the dark synchronized with pulse electric fields up to E≈5 kV/cm of 10 ms duration, so as to measure the photoresponse. Second, for moderately conducting specimens #S60 and #S135 ($\rho \leq 10^{-2}$-$10^{-1}\Omega$-cm) at 300K, regular resistive measurements were carried out by adopting the usual four-probe method without using light.

The specimen #S54 was made by mixing 0.986 g of $BaCO_3$ and 1.165 g of $Bi_2O_3$, and sintering the mixture so as to produce $BaBiO_3$. The specimen #S129 was made by mixing 0.789 g of $BaCO_3$, 0.745 g of $Bi_2O_3$, and 0.178 g of PbO, and sintering the mixture so as to produce $BaPb_{0.2}Bi_{0.8}O_3$. Similarly, the specimen #S128 was made by mixing 0.789 g of $BaCO_3$, 0.559 g of $Bi_2O_3$, and 0.357 g of PbO, and sintering the mixture so as to produce $BaPb_{0.4}Bi_{0.6}O_3$, while the specimen #S135 was made by mixing 0.789 g of $BaCO_3$, 0.466 g of $Bi_2O_3$, and 0.446 g of PbO, and sintering the mixture so as to produce $BaPb_{0.5}Bi_{0.5}O_3$. Further, the specimen #S60 was made by mixing 0.986 g of $BaCO_3$, 0.465 g of $Bi_2O_3$, and 0.669 g of PbO, and sintering the mixture so as to produce $BaPb_{0.6}Bi_{0.4}O_3$. Here, z represents the amount of oxygen in the substance, and it varies depending on the sintering conditions so as to produce a variety of final products. In the subject studies, oxides with z in the proximity of 3 (z≈3) were checked in the main.

Static magnetic susceptibility or magnetization itself was measured in weak fields up to H≈500 Oe by using a microwave SQUID (Superconducting Quantum Interference Device) at 9 GHz as shown in FIGS. 3A, 3B and 3C. The knowledge on the superconductivity of the oxide of the above system belongs to the public, and what is important here is the properties of oxides with x≧0.35. Only the properties of the oxides with such value of x will be dealt with here without getting into details of the public knowledge.

Spectral responses were studied by selecting the wavelength λ from a dye laser with a resolution Δλ≈1 nm while using an appropriate normalization procedure for incident power from the laser and spectral sensitivity of the pyroelectric detector. A possibility of heating of the specimens by light excitation was minimized and estimated to be negligible. Photocarrier density was of the order of or less than $10^5$ to $10^7$/$cm^3$. All photosignals were normally detected in the synchronized mode by using the Boxcar integrator.

Experimental Results

The inventor observed definite signals of photoconductivity in all the specimens of Ba-$Pb_{1-x}$-$Bi_x$-$O_z$, i.e., the specimens #S54 (x=1) through #S60 (x=0.40), by using the transient pulse technique described above.

Firstly, the dependence of photoconductivity $Q(\lambda,T,E,H)$ on the electric field E at 4.2K was found to be substantially liner up to E≦4 kV/cm.

Figure 4A:
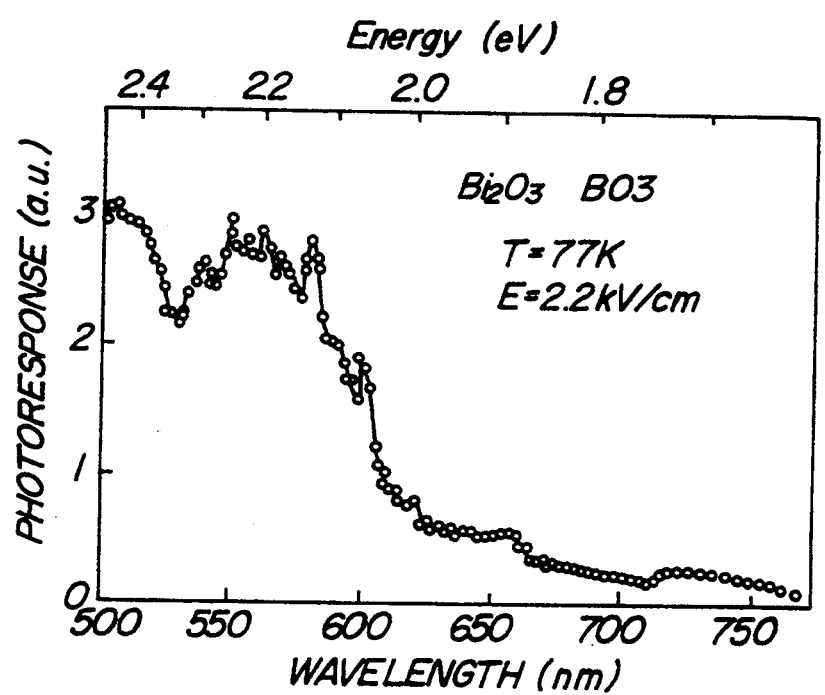
FIG. 4A is a graph showing the wavelength-dependence of photoresponse $Q(\lambda, T)$ of reference substance $Bi_2O_3$.
Figure 4B:
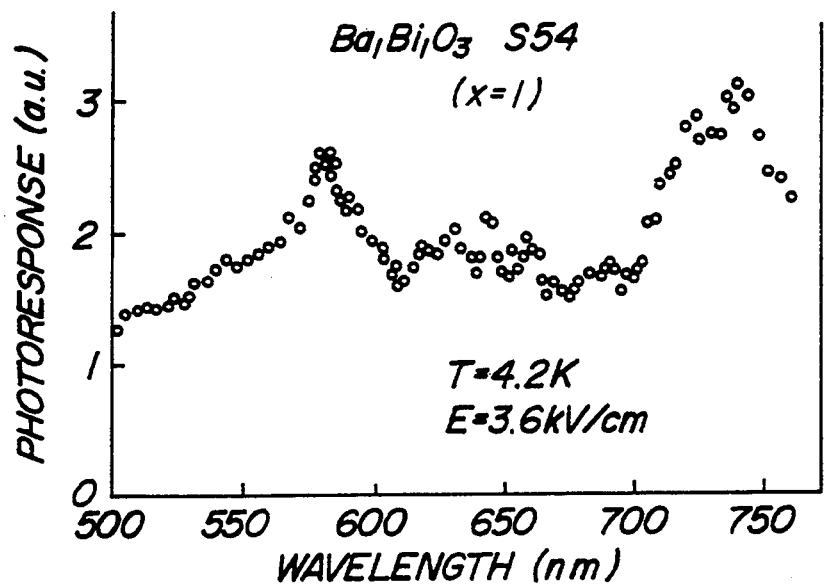
FIG. 4B is a graph showing the wavelength-dependence of photoresponse $Q(\lambda, T)$ of a superconductive photoconductive oxide of composition $Ba_1Bi_xO_3$ (for x=1, i.e., $Ba_1Bi_1O_3$)
Figure 4C:
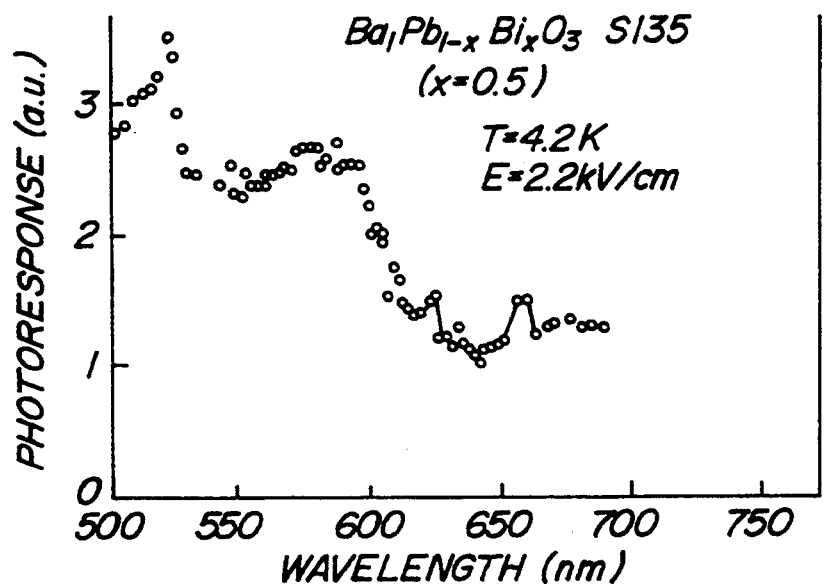
FIG. 4C is a graph showing the wavelength-dependence of photoresponse $Q(\lambda, T)$ of a superconductive photoconductive oxide of composition $Ba_1Pb_{1-x}Bi_xO_3$ (for x=0.5)

FIG. 4A illustrates a typical spectrum of pulse-excited transient photoresponse $Q(\lambda, T)$ of the reference specimen #B03 $Bi_2O_3$ over wavelengths λ of about 500-700 nm, FIG. 4B illustrates a similar spectrum of the specimen #S54 $Ba_1$-$Bi_1$-$O_z$ (z being about 3), and FIG. 4C illustrates a similar spectrum of specimen #S135 $Ba_1$-$Pb_{1-x}$-$Bi_x$-$O_z$ (x=0.5, z≈3).

Secondly, temperature dependence of the pulse-excited transient photoresponse $Q(\lambda, T)$ in the wavelength range of λ≈500-700 nm was studied by using the reference specimen #B03, the insulator specimen #S54 and the specimen #S60 with a potential superconductivity. The results for the three specimens are shown in FIG. 5A, FIG. 5B, and FIG. 5C, respectively. Surprising, there definitely exists a systematic similarity of the transient photoresponse $Q(\lambda, T)$ between the specimens #S54 and #S60, in spite of a huge difference in dark resistivity $\rho$(T) therebetween. The dark resistivity $\rho$(T) of the specimen #S54 is actually very large $\rho \geq 10^7$ Ω-cm. As can be seen from FIG. 5B, with the decrease of temperature, the "photoconductivity" of the specimen #S54 begins to appear at about 160K, assumes a maximum value at 100-110K, remains comparatively flat at 65-80K and 30-40K, decrease gradually with the temperature until 20K, and increases again at the temperature below 20K. Thus, at the temperature below 20K, both the insulator specimen #S54 and the semiconductor specimen #S60, which is close to a superconductor, increase their photoresponse $Q(\lambda, T)$.

Finally, the dark resistivity $\rho$(T) of $Ba_1$-$Pb_{1-x}$-$Bi_x$-$O_z$ (x=0.25) of specimen #S54, which is a superconductor, was measured as a function of temperature, while comparing it with that of $Ba_1$-$Pb_{1-x}$-$Bi_x$-$O_z$(x=0.4) of specimen #S60, which is close to a superconductor. As expected, the specimen #S54 showed superconductivity at a temperature below its critical temperature $T_c$ of about 4.2-12K.

It is by no means easy to interpret these experimental facts. At 300K, the specimen #S54 Ba-Bi-$O_3$ is clearly an insulator and the specimen #S60 $Ba_1$-$Pb_{1-x}$-$Bi_x$-$O_z$ (x≈0.4, z≈3) is a semiconductor. With the specimens in a range of x≈0.35-0.4, their photoconductivity observed with the blocking electrodes is compatible with their superconductivity. This is probably due to the insulating part of specimen #S60. Surprisingly, there exists an occurrence of photoconductivity potentially correlative with superconductivity underlying even in insulating specimen #S60 as displayed in FIG. 5C.

Discussion

It is a widely recognized fact that, of the oxides of $Ba_1\text{-}Pb_{1-x}\text{-}Bi_x\text{-}O_3$ system, the specimen Ba-Bi-O such as specimen #S54 usually have brown color mixed with golden color. The specimen #S129 looks brown. Specimens like #S60 look regular reddish black. The superconductor ($x=0.35$) specimen #S58, which has not been referred to here, looks navy-bluish black. Even the superconductor ($x=0.25$) specimen #S55 looks bluish black. The spectral photoresponse $Q(\lambda, T)$ of FIGS. 4A, 4B and 4C strongly suggests that there exists a region of the $Bi_2O_3$-like state at least in the specimen of $Ba_1\text{-}Bi_1\text{-}O_z$ and possibly even in those of $Ba_1\text{-}Pb_{1-x}\text{-}Bi_x\text{-}O_z$, if not atomic or molecular layers. As the signals $Q(\lambda,T)$ are clearly observed, one has to recognize that either conduction electrons or positive holes or even both are mobile in insulating Ba-Bi-O and Ba-Pb-Bi-O specimens.

Optical absorption and photoconductivity of $Bi_2O_3$ have been little analyzed in terms of the exciton theory. We can recognize similar absorption edges with a few fine structures perhaps due to the excitons in the spectra of $Q(\lambda)$ of both $Ba_1\text{-}Bi_1\text{-}O_z$ and $Ba_1\text{-}Pb_{1-x}\text{-}Bi_x\text{-}O_z$ system oxides which are similar to those of $Bi_2O_3$. Thus, we can reasonably conceive that there exists at least a finite fraction of the $Bi_2O_3$-like phase which cannot be ignored in the Ba-Bi-O and Ba-Pb-Bi-O systems where the photoexcited electrons and holes are definitely mobile in spite of sight deviation of crystal structures. If we consider that the reason for it is in the degree of oxygen vacancy and their state of order as suggested recently, the probability of its occurrence seems to be rather high. Data obtained by the inventor's experiments reveal the existence of pentavalent $Bi^{5+}$ ions besides trivalent $Bi^{3+}$ ions. Results of the energy band calculation and an evaluation of the density of states (DOS) also indicate similar tendencies.

A conduction electron or a positive hole in standard types of $Bi_2O_3$ crystals has been reported to have a rather large coupling constant $\alpha$ with the LO-phonons in the polaron formation, which results in a comparatively "small polaron". Further, it must have a much larger effective dielectric constant $\kappa$ and a coupling constant $\alpha$ in the $Bi_2O_3$-like part, possibly enhanced due to an order of oxygen vacancy in the $Ba_1\text{-}Pb_{1-x}\text{-}Bi_x\text{-}O_z$ specimens as a series of ferroelectric materials with a large static dielectric constant. In fact, the present studies are based on the fact that the oxides are likely to have strong electron-phonon interaction and are good candidates for polaron formation due to lattice deformation caused thereby. The dynamical effects of the polaron, whether it is a "large polaron" with the LO-phonons, a much localized "small polaron" or possibly an intermediate one due to both effects, they must be substantial as well as the "electronic polaron effect". They, i.e., those polarons due to phonons and due to electrons, are probably effective in a coherently hybridized form of these elementary excitations.

Therefore, we may reasonably conceive of potential roles of an ensemble of polarons, whether large or small, and excitons in the phenomena of superconductivity here. The ensemble of united polarons and excitons are probably a set of bipolarons, polaronic excitons and/or excitonic polarons due to the dynamical electron-phonon and electron correlation effects. These polarons and excitons had yielded out of the optical transition from the hybridized 2p-Oxygen and 6s-Bi valence bands leaving a $(2p)^6(6s)^1$ positive hole to the 6p-Bi conduction band creating a $(6p)^1$ conduction electron together with the LO-phonon interaction. A polaron can be created either by the optical excitation here or substitution of Bi by Pb especially in the Ba-Bi-O system. As indicated in FIG. 5C, photosignals or photoresponse $Q(\lambda g, T)$ in the $Ba_1\text{-}Pb_{1-x}\text{-}Bi_x\text{-}O_z$ system, with $x=0.40$ and $z=3$, reflect the occurrence of superconductivity in this system. Similar phenomena have been observed also in the Y-Cu-O, Y-Ba-Cu-O and La-Cu-O systems. Consequently, the inventor believes that these studies of elementary excitations here must reveal the nature of the superconducting ground state. To the best knowledge of the inventor, this is the first clear experimental indications of the polarons and exciton mechanisms displayed in the high-$T_c$ superconductivity and the perfect diamagnetism as far as the oxides of the invention are concerned.

Effect of the Invention

As described in detail in the foregoing, the inventor has observed, for the first time, an unexpected accordance of the onsets of profound significance, i.e., "the correlation of photoconductivity with superconductivity and perfect diamagnetism", at least in oxide with a chemical formula of $Ba_1\text{-}Pb_{1-x}\text{-}Bi_x\text{-}O_z4$, x being 0.40 to 1 and z being 2.7 to 3. A method for producing the above oxide has been also developed.

It should be noted that the invention is an outcome of the inventor's theoretical and experimental studies on the "dynamical mechanism of polarons and excitons" for "high-temperature superconductivity" in a temperature range of 4.2 to 300K. In the experimental studies, the inventor used the D.C. four-probe method and the repetitive pulse photoconductivity method for measurement of the conductivity, and the microwave SQUID for the measurement of static magnetic susceptibility. The proposed oxide of the invention will open a new scientific and industrial field, to be named as "superconductive optoelectronics", wherein superconductivity is directly controlled by light.

Although the invention has been described with a certain degree of particularity, it is understood that the present disclosure has been made only by way of example and that numerous changes in details may be resorted to without departing from the scope of the invention as hereinafter claimed.

What is claimed is:

1. A method of eliciting photoconductivity $Q(\lambda,T)$ from a photoconductive substance of the Ba-Pb-Bi-O system having a general chemical formula of $BaPb_{1-x}Bi_xO_z$, x being 0.4 to 1 and z being 2.7 to 3, comprising the steps of:

(a) exposing the substance to incident light of wavelength ($\lambda$) in the range of 500 to 700 nm and applying an electric field E to said substance while cooling the substance to a temperature (T) below 160K, thereby allowing electric current to flow through the photoconductive substance, wherein said substance is an insulator or a semiconductor in the dark.

2. A method as in claim 1, wherein the temperature at which the photoconductivity $Q(\lambda, T)$ of the photoconductive substance emerges and increases corresponds to the onset temperature (T) of superconductivity in a superconductive substance of the Ba-Pb-Bi-O system.

3. A method as in claim 1, wherein the photoconductivity $Q(\lambda, T)$ of the photoconductive substance is increased upon exposing the photoconductive substance to the incident light of the wavelength ($\lambda$) in the range of 500 to 700 nm at the temperature (T) below 160K.

4. A method as in claim 1, wherein said exposing step is carried out by exposing the photoconductive substance to light from a dye laser.

5. A method as in claim 1, wherein said exposing step generates a photocarrier density in the photoconductive substance of from $10^5$ to $10^7/cm^3$ averaged over the substance.

6. A method as in claim 4, wherein said light from a dye laser is pulsed light.

7. A method as in claim 6, wherein said pulsed light is of 3 ns width at a repetition rate of 13 Hz in the dark synchronized with pulse electric fields up to E=5 KV/cm of 10 mS duration.

8. A method of eliciting photoconductivity $Q(\lambda,T)$ from a photoconductive substance of the Ba-Pb-Bi-O system having a general chemical formula of $BaPb_{1-x}Bi_xO_z$, x being 0.4 to 1 and z being 2.7 to 3, comprising the steps of:

(a) exposing the substance to laser light of wavelength ($\lambda$) in the range of 500 to 700 nm and applying an electric field E to said substance while cooling the substance to a temperature (T) below 160K, thereby allowing electric current to flow through the photoconductive substance, wherein said substance is an insulator or a semiconductor in the dark.

* * * * *